US006516432B1

(12) United States Patent
Motika et al.

(10) Patent No.: US 6,516,432 B1
(45) Date of Patent: Feb. 4, 2003

(54) AC SCAN DIAGNOSTIC METHOD

(75) Inventors: Franco Motika, Hopewell Junction, NY (US); Phillip J. Nigh, Williston, VT (US); Peilin Song, Wappingers Falls, NY (US); Howard B. Druckerman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,699

(22) Filed: Dec. 22, 1999

(51) Int. Cl.[7] .............................................. G01R 31/28
(52) U.S. Cl. ....................... 714/732; 714/728; 714/729; 714/735; 714/733; 714/726
(58) Field of Search ................................ 714/727, 732, 714/733, 726, 728, 729, 731, 738, 744; 708/254; 712/227

(56) References Cited

U.S. PATENT DOCUMENTS

| | | | |
|---|---|---|---|
| 3,761,695 A | | 9/1973 | Eichelberger |
| 5,025,344 A | | 6/1991 | Maly et al. |
| 5,329,533 A | * | 7/1994 | Lin .............................. 714/727 |
| 5,383,143 A | * | 1/1995 | Crouch et al. ............... 708/254 |
| 5,640,402 A | | 6/1997 | Motika et al. |
| 5,761,489 A | * | 6/1998 | Broseghini et al. .......... 712/227 |
| 5,831,992 A | * | 11/1998 | Wu ............................. 714/732 |
| 5,930,270 A | | 7/1999 | Forlenza et al. |
| 6,327,685 B1 | * | 12/2001 | Koprowski et al. ......... 714/733 |

OTHER PUBLICATIONS

Song et al., "Diagnostic Techniques for the IBM S/390 600 MHz G5 Microprocessor," ITC International Test Conference, 1999, pp. 1073–1082.

D.P. Vallet, "IC Failure Analysis: The Importance of Test. and Diagnostics" IEEE Design & Test. of Computers, Jul.–Sep. 1997, pp. 76–82.

S. Edirisooriya and G. Edirisooriya, "Diagnosis of Scan Path Failures", Proceedings of 1995 IEEE VLSI Test. Symposium, Apr. 1995, pp. 250–255.

S. Kundu, "Diagnosing Scan Chain Faults", IEEE Trans. on VLSI Systems, vol. 2, No. 4, Dec. 1994, pp. 512–516.

J.L. Schafer, F.A., Policastri, and R.J. McNulty, "Partner SRLs for Improved Shift Register Diagnostics", Proceedings of 1992 IEEE VLSI Test. Symposium, 1992, pp. 198–201.

P.H. Bardell and W.H. McAnney, "Self–Testing of Multichip Modules," Proceedings of the IEEE International Test. Conference, 1982, pp. 200–204.

E.B. Eichelberger and T.W. Williams, "A Logic Design Structure for LSI Testability", Proceedings of the 14th Design Automation Conference, New Orleans, 1977, pp. 462–468.

\* cited by examiner

Primary Examiner—David Ton
(74) Attorney, Agent, or Firm—Lynn L. Augspurger

(57) ABSTRACT

Disclosed is an alternating current (AC) scan diagnostic system in which one or a plurality of scan chains are tested by serially propagating predetermined bit patterns through the scan chain and comparing the output against an expected result. The system comprises identification phase, verifications and localization, and a characterization phases. The system is adaptable for use with on-board diagnostics and is adaptable for use with on-product clock generation systems.

16 Claims, 8 Drawing Sheets

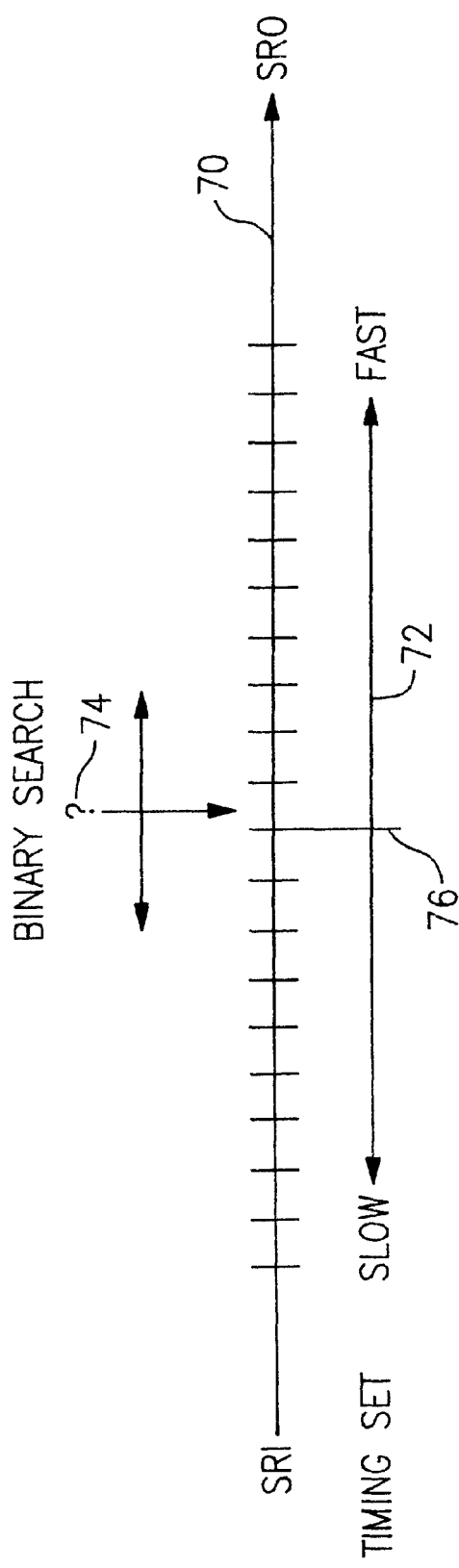
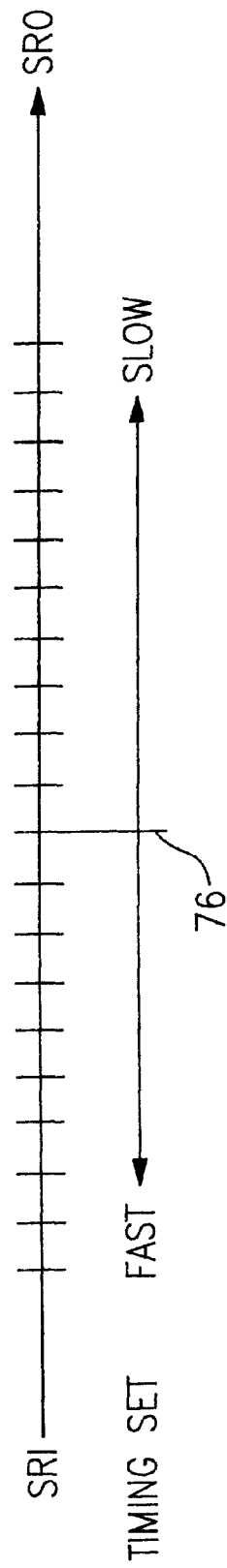
FIG.5a
FIG.5b

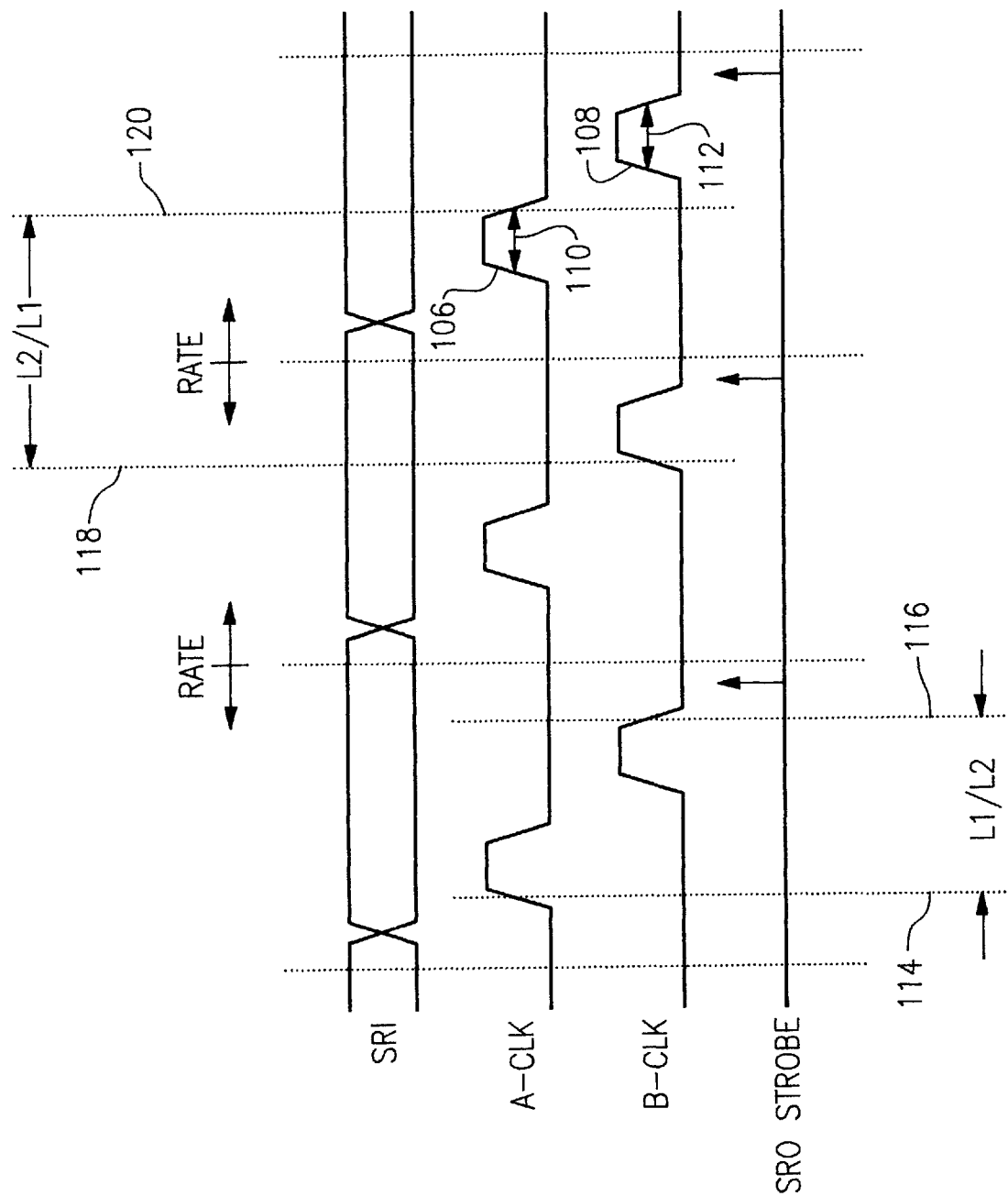

AC SCAN DIAGNOSTIC METHOD

FIELD OF THE INVENTION

The present invention is generally related to testing and diagnosing integrated circuits and, more particularly, to testing and diagnosing alternating current scan chain defects and localizing these defects to a particular shift register latch or associated clock tree.

BACKGROUND

Integrated circuit technology typically utilizes scan based design methodologies and techniques in order to facilitate design, testing, and diagnostic procedures. The scan based design methodology typically reconfigures sequential logic into combinational logic blocks which are interconnected by shift register latches. Typical alternating current (AC) scan design tests the operation of the shift register latches by serially loading and unloading predetermined bit patterns through the shift register latches. The serial output bit patterns are compared to the input patterns to identify faulty latches.

Current scan based designs typically use scan chains to detect AC defects. However, these scan chains are typically tested through the application of external inputs. Presently, no AC scan chain configurations have utilized built-in self test features or on-board clock support.

SUMMARY OF THE INVENTION

This invention is directed to an apparatus for performing AC scan chain built-in self test and diagnostics of an integrated circuit. The apparatus includes a reconfigurable linear feedback shift register (LFSR) having an input and a plurality of output lines. The LFSR generates a bit pattern. A plurality of scan chain latches interconnect to the LFSR, and each scan chain latch serially receives at a respective input the bit pattern output by the LFSR. Each scan chain latch propagates the bit pattern from the respective input to a respective output of each scan chain latch. A multiple input signature register (MISR) receives the bit patterns output by the respective scan chain latches, and generates a signature in accordance with the bit patterns input from the scan chain latches. A comparison circuit compares the signature with an expected signature based upon the pattern input to the plurality of scan chain latches. A controller reconfigures the LFSR to vary bit patterns output by the LFSR and varies the timing sequence of the LFSR, the plurality of scan chain latches, the MISR, and the comparison circuit. When the signature is equal to the expected signature, the scan chain latches are functioning correctly.

These and other improvements are set forth in the following detailed description. For a better understanding of the invention with advantages and features, refer to the description and to the drawings.

DESCRIPTION OF THE DRAWINGS

FIGS. 5a–5b illustrates a timing set variation for a binary search for carrying out the verification and localization phase of the AC scan chain test procedure;

FIG. 7 illustrates a timing diagram for clock and data signals for the AC scan chain test procedure;

DETAILED DESCRIPTION OF THE INVENTION

Figure 1:
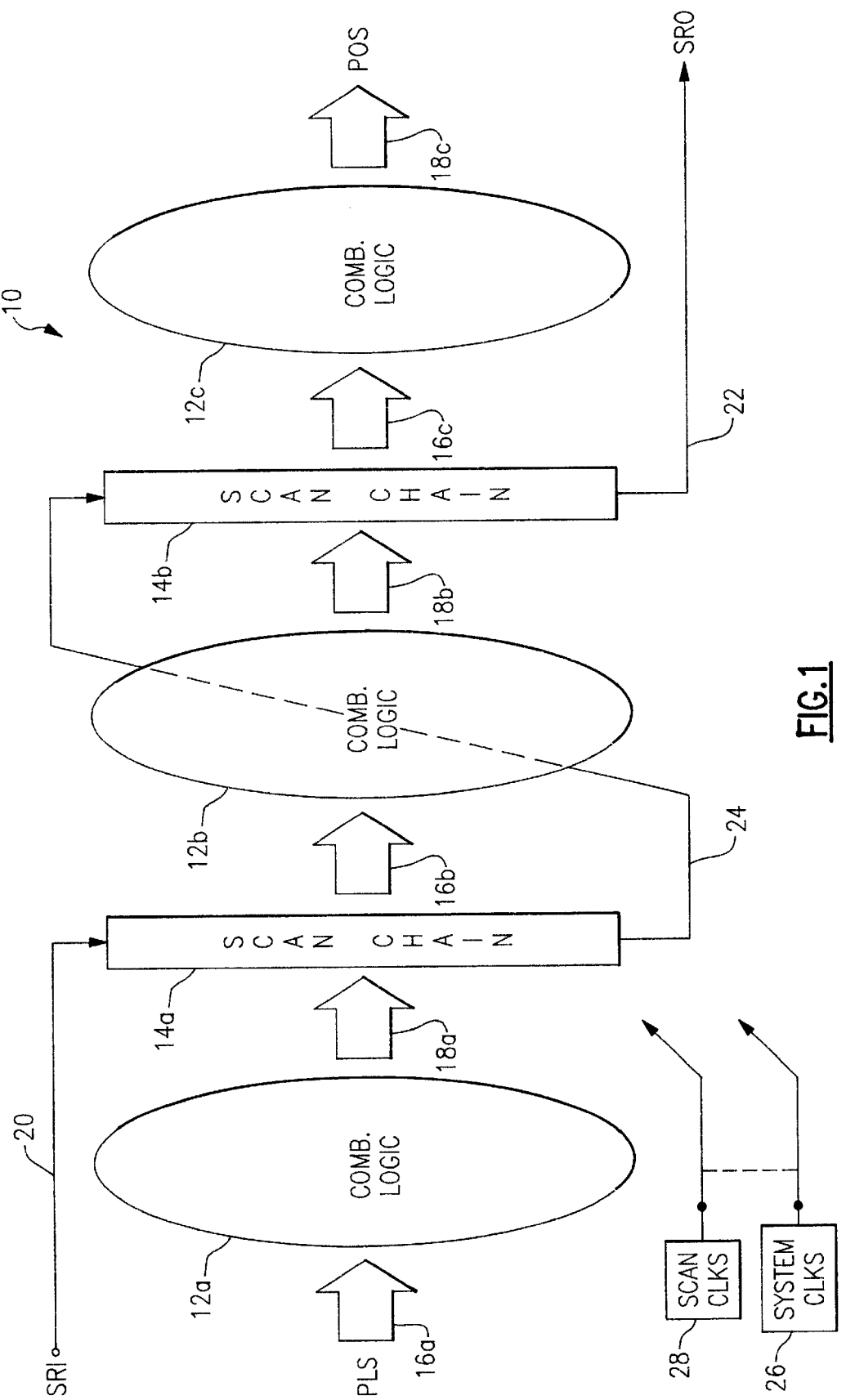
FIG. 1 illustrates a block diagram of a typical level sensitive scan design (LSSD) configuration.

With respect to FIG. 1, FIG. 1 illustrates a typical level sensitive scan design (LSSD) configuration 10. The LSSD configuration 10 includes combinational logic blocks 12a, 12b, 12c. The combinational logic blocks 12a, 12b, 12c represent combinational logic which executes various predetermined functions. The combinational logic blocks are interconnected by scan chain 14 a, which interconnects combinational logic blocks 12a and 12b and scan chain 14b, which interconnects combinational logic blocks 12b and 12c. Scan chains 14a, 14b include shift register latches (SRLs) interconnected, as will be described.

Data is input to combinational logic blocks 12a, 12b, 12c in a parallel or broadside manner via respective primary input (PI) vectors 16a, 16b, 16c. PI vectors 16b, 16c may more specifically be referred to as pseudo-PI vectors. Data is output from combinational logic blocks 12a, 12b, 12c in a parallel fashion to primary output (PO) vectors 18a, 18b, 18c, respectively. PO vectors 18a, 18b may more specifically be referred to as pseudo-PO vectors. PO vectors 18a, 18b function as PI vectors to respective scan chains 14a, 14b. Similarly, PI vectors 16b, 16c function as parallel outputs from respective scan chains 14a, 14b.

Scan chains 14a, 14b may also be loaded serially to enable testing of scan chains 14a, 14b. In particular, serial input (SRI) line 20 provides a serial input to scan chain 14a. Similarly, serial output line (SRO) 22 provides an output from scan chain 14b. Scan chains 14a, 14b are interconnected by serial line 24. Serial line 24 functions as an SRO for scan chain 14a and as an SRI for scan chain 14b. One or a plurality of system clocks 26 output timing signals to control timing operations of the combinational logic blocks 12 and scan chains 14. One or a plurality of scan chain clocks 28 provide timing signals to scan chains 14.

Figure 2:
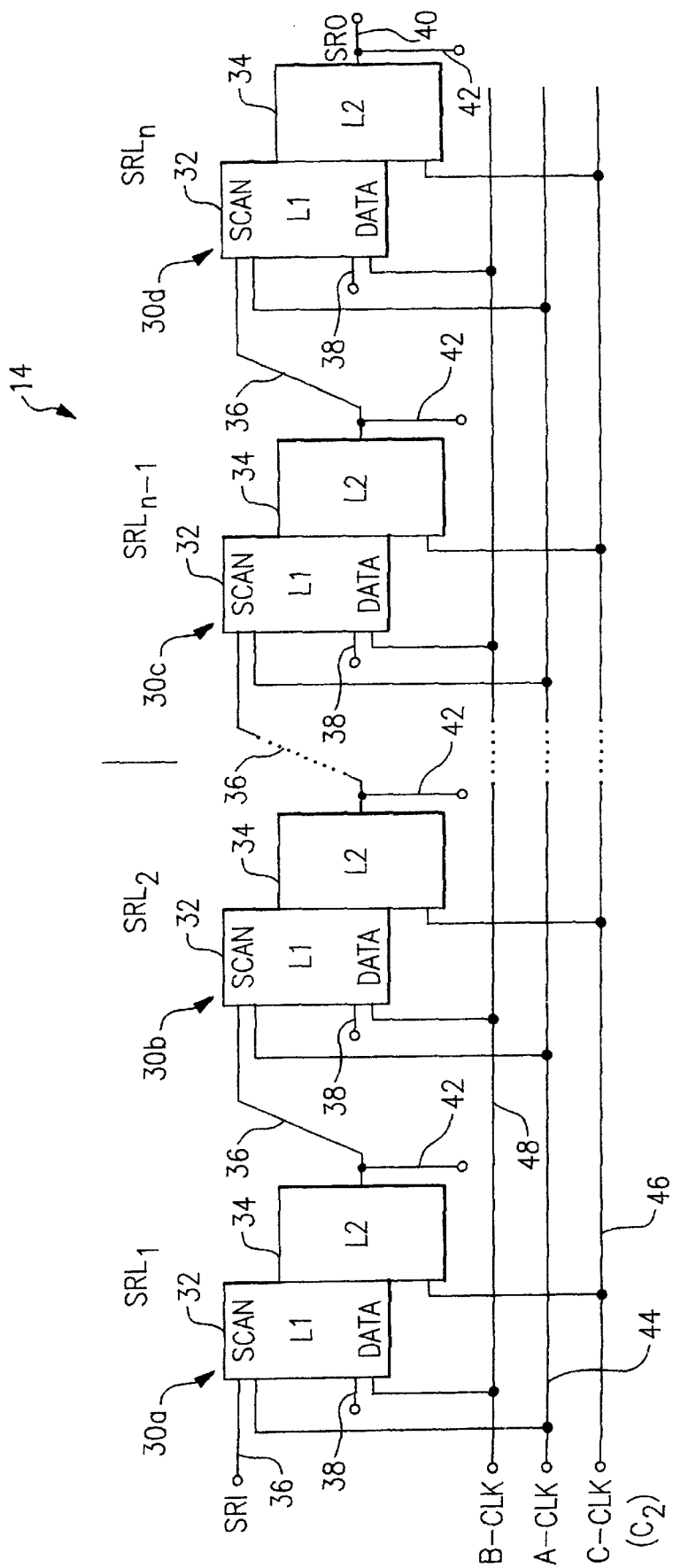
FIG. 2 illustrates a block diagram of a level sensitive scan design scan chain.

FIG. 2 depicts an exemplary scan chain 14. Scan chains 14 comprises a plurality of shift register latches (SRL) 30, also designated as $SRL_1$, $SRL_2$, ..., $SRL_{N-1}$, $SRL_N$. Thus, scan chain 14 comprises a plurality of shift register latches 30a, 30b, 30c, 30d. The number of shift register latches 30 depends upon the width of PI vectors 16 and PO vectors 18. Each SRL 30 includes a master latch 32 and a slave latch 34. Serial data, such as described with respect to FIG. 1, is input to master latch 32 on SRI line 36. Each bit line of the primary input PI vector is input to a respective parallel data line 38. As will be described in greater detail, data is clocked into each SRL 30 by applying a clock pulse to master latch 32. Data is clocked out of each SRL 30 by applying a clock pulse to slave latch 34. Data is output from slave latch 34 to a succeeding master latch 32, or with respect to SRL 30d, SRO line 42. Each SRI line 36 and SRO line 40 may also function as a parallel output data line 42 to effect a parallel output from scan chains 14, as described in FIG. 1.

The operational timing of scan chain 14 is effected by system and scan clock signals as referred to in FIG. 1. In particular, serial loading of master latch 32 occurs upon generation of an A-clk pulse on A-clk line 44. The A-clk pulse on A-clk line 44 causes serial input applied to SRI line 36 to be input to each master latch 32. Application of a B-clk pulse on B-clk line 46 causes data from L1 to be output from SRL 30 via slave latch 34 to L2. The continuous, alternating application of A-clk and B-clk clock pulse signals on respective A-clk line 44 and B-clk line 46 sequentially propagates a data signal applied to SRI 36 of SRL 30a through scan chain 14. To effect a parallel load, a $C_1$-clk clock pulse is applied to C-clk line 48 to cause a parallel load of data via parallel data lines 38 to each master latch 32 of SRL 30. Application of a $C_2$-clk clock pulse to B-clk line 46 causes a parallel output of data from each slave latch 34 of SRL 30 to provide data on respective parallel output data lines 36 and 42. With reference to FIG. 1, $C_1$-clk and $C_2$-clk clock pulses correspond to system clocks 26, and A-clk and B-clk clock pulses correspond to scan clocks 28 of FIG. 1.

In typical level sensitive scan design (LSSD) configurations, each scan chain 14 can be used as a pseudo-primary input and a pseudo-primary output of each combinational logic block 12 in addition to the PIs and POs for LSSD circuit 10. This extends the number of the stimulation observability points of the device being tested or diagnosed. A major drawback of this test methodology is encountered when the scan chain does not function properly and access to the internal logic of the device is greatly reduced. This is often the case early in the technology or the product introduction cycle when yields are relatively low. In such situations, the rapid determination of the root cause is critical, but such root cause can prove difficult to diagnose. In such low yield situations, failures often relate directly to the scan chain. Scan based designs are fairly common, and the scan chains represent a significant portion of the active surface area of an integrated circuit. Thus, a solution which speeds AC diagnostics of defective or questionable integrated circuits provides timely yield improvements, thereby insuring successful production of the design. Preferably, a scan chain fault can be diagnosed within a manageable number of logic blocks in the minimum time. This expedites isolation of further investigation using conventional physical failure analysis tools.

Figure 3:
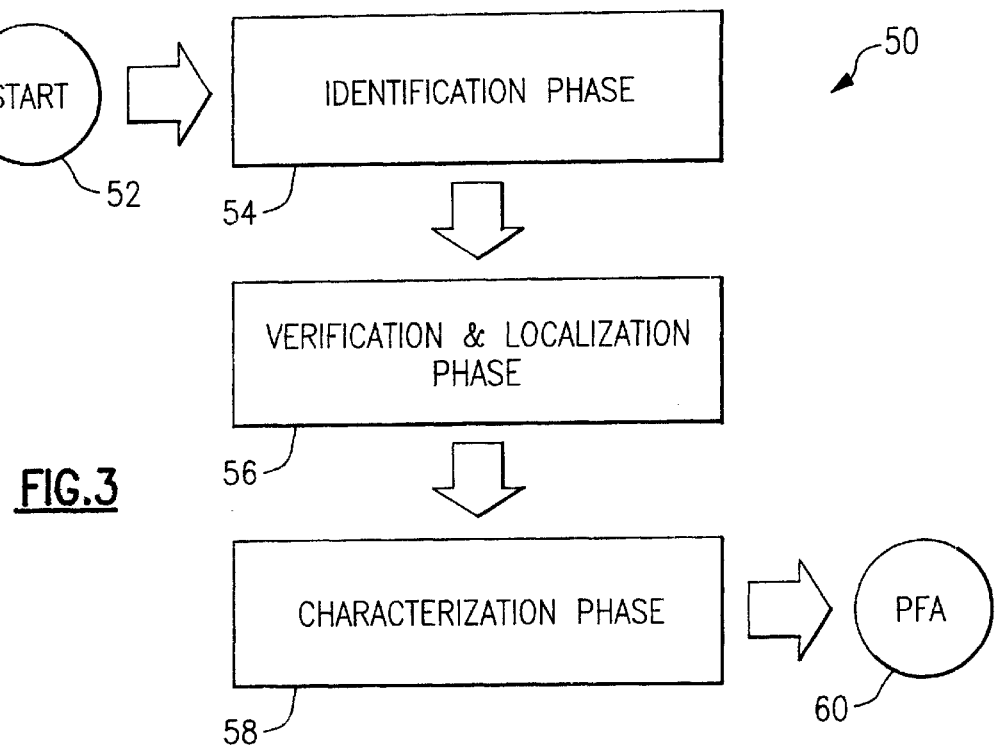
FIG. 3 illustrates a block diagram of the method for carrying out an alternating current scan chain diagnostic procedure.

FIG. 3 illustrates a flow diagram for an AC scan diagnostic approach to testing scan chains. With reference to FIG. 3, the AC scan diagnostic method 50 will be described. Control of the AC scan diagnostic method 50 commences at start block 52. Control proceeds to identification phase 54. As will be described in greater detail herein, identification phase 54 establishes a stable test condition that exposes a potential AC fail condition. This is typically accomplished by varying several environment variables., power settings, and timing parameters in conjunction with the application of diverse scan pattern sequences. Table 1 illustrates exemplary scan pattern sequences that may be propagated through a particular scan chain. In addition to those sequences depicted in Table 1, additional, alternative sequences may also be propagated through a scan chain to be tested.

TABLE 1

| Pattern Name | Pattern Example |
|---|---|
| Alternate 00/11 pair | . . . 00110011 . . . |
| Alternate 0/1 pair | . . . 01010101 . . . |

TABLE 1-continued

| Pattern Name | Pattern Example |
|---|---|
| Propagate single 1 | . . . 00001000 . . . |
| Propagate single 0 | . . . 11110111 . . . |
| Propagate 0-to-1 transition | . . . 00001111 . . . |
| Propagate 1-to-0 transition | . . . 11110000 . . . |
| Adjacent latch sequence 1 | . . . 00011100 . . . |
| Adjacent latch sequence 0 | . . . 11100011 . . . |

When a scan chain design incorporates multiple scan chains or allows for reconfiguration of scan chains, the pattern sequences described with respect to Table 1 may be applied to one or more chains while the remaining chains are held in a quiescent 0 or 1 state. When a design includes greater numbers of scan chains, the number of possible pattern combinations can become relatively large, requiring selection of patterns for propagation through the scan chains. Multiple chain test methodologies include propagating predetermined bit patterns through all scan chains; propagating predetermined sequences through a single chain while all other scan chains propagate a 0; propagating a predetermined pattern through a singe chain while all other scan chains propagate a 1; and/or propagation either of the previous two sequences through multiple scan chains.

Once the AC fail can be replicated and is stable, the diagnostic pattern sequences which rendered the AC fail can be utilized in the verification and localization phase 56 of FIG. 3, which is the next phase of the diagnostic process. In situations where identification phase 54 cannot successfully replicate an AC fail sequence, specialized patterns may be generated, but such patters do not lend themselves to automated diagnostic procedures.

In the verification and localization phase 56, the AC scan diagnostic method 50 selects a specific failing test pattern sequence and verifies the passing reference point and the failing test point conditions. The two test points and previously identified failing pattern or patterns are used to localized the failure to a specific shift register chain, latch, or range of latches. Such localization occurs by modifying the above pattern and timing in conjunction with execution of a search algorithm, such as a binary search algorithm, as will be described with respect to FIGS. 4–6.

FIG. 4 illustrates exemplary timing set variations for determining the passing reference point and the failing test point conditions. In particular, FIG. 4a defines a generic timing variation structure for the verification and localization phase. A diagnostic pattern sequence propagates from an SRI to an SRO through a series of scan chain latches. Space between each vertical tick mark on the time line 62 between the SRI and SRO represents a particular scan chain.

Figure 4A:
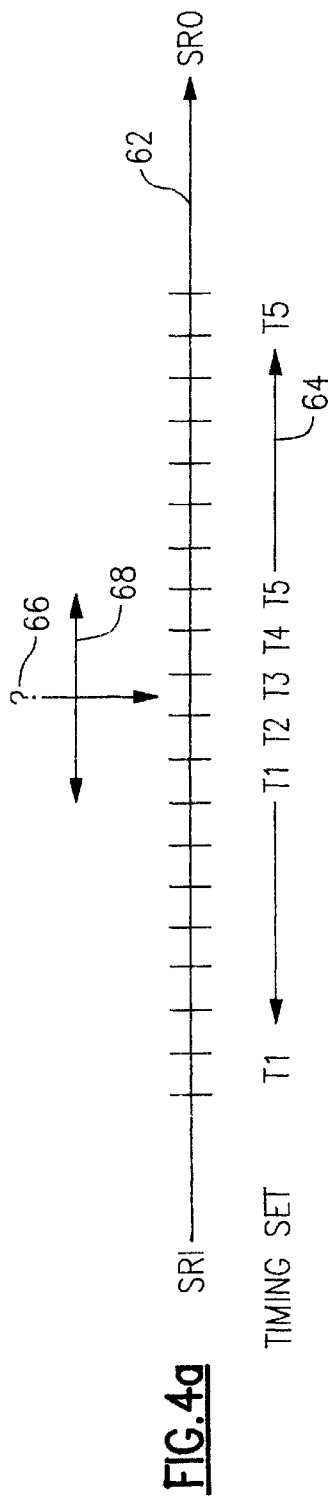
FIGS. 4a–4d illustrates timing set diagrams for varying the timing sequence of the identification phase of the AC scan chain process depicted in FIG. 3.

FIG. 4a depicts a generalized timing set variation diagram. The horizontal line between SRI and SRO defines a shift register latch (SRL) line 62, and the lower line represents a timing set line 64. The symbol 66 represents the particular latch where a timing set change occurs. Horizontal line 68 demonstrates that the timing set change may occur across any of the SRLs and may be shifted left or right along the SRL line 62. Similarly, the arrows on timing set line 64 indicate that the timing sets can be varied across the many latches along the SRL line 62.

A plurality of timing sets T1, T2, T3, T4, and T5 represent potential timing set variations for propagating the diagnostic pattern sequence between the SRI and SRO through the latches of the scan chain. Timing sequences T1–T5 represent the timing sets implemented using scan clocks 28 of FIG. 1.

As the diagnostic pattern traverses the scan chain, a particular timing set may generate an AC fail in a specific scan chain latch. By varying the diagnostic pattern and the timing set, the specific latch of the scan chain may be localized and the passing reference and failing test point conditions may be determined using binary search methodologies discussed with respect to FIG. 5.

Figure 4B:
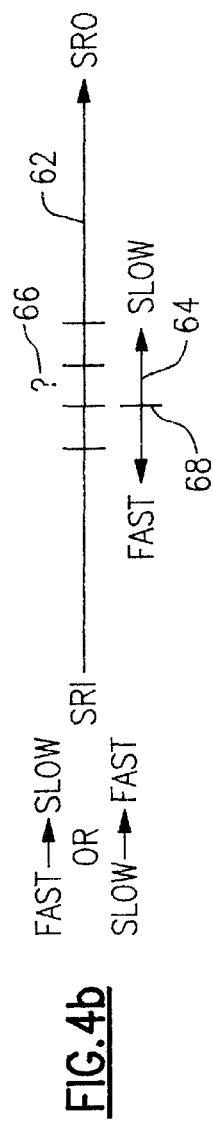
Figure 4C:
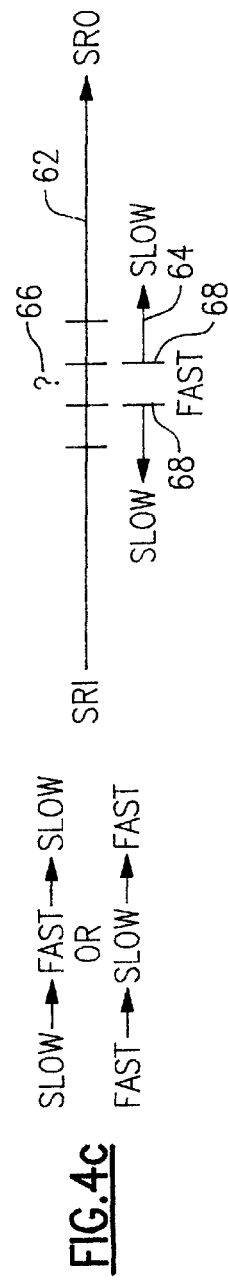
Figure 4D:
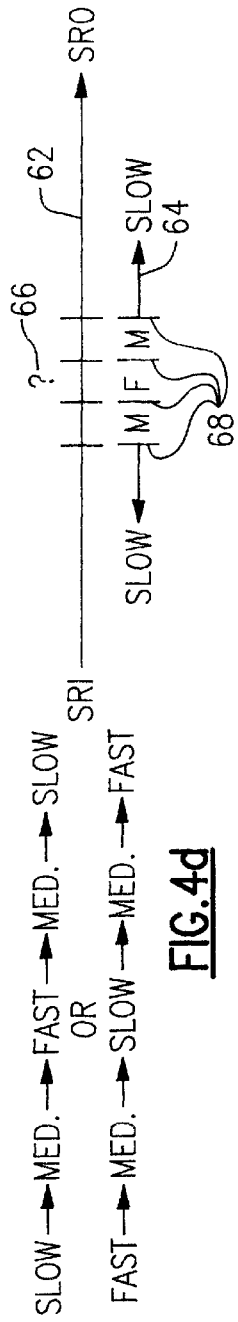

FIGS. 4b, 4c, and 4d are exemplary, particularized versions of FIG. 4a for varying the timing sets T1, T2, T3, T4, and T5. In particular, FIG. 4b represents a fast to slow timing set transition and a complimentary slow to fast timing set transition. FIG. 4b includes a SRL line 62, a timing set line 64, and symbol 66, indicating the timing set changeover point. The fast and slow timing sets correspond to respective timing sets Tx or Ty, where x and y are integers corresponding to the number of timing sets. The sequential implementation of timing sets Tx and Ty and Ty and Tx represent complimentary timing sets which are preferably executed for predetermined patterns to fully verify and localize an SRL failure. In an even more detailed timing set transition sequence, which is particularly applicable for use during the characterization phase 58, FIG. 4c is similarly arranged as FIG. 4b including an SRL line 62, a timing set line 64, a symbol 66, and horizontal line 68. FIG. 4c represents a slow/fast/slow timing set transition sequence and a complimentary fast/slow/fast timing set transition sequence. FIG. 4d illustrates a slow/medium/fast/medium/slow timing set transition sequence for respective timing sets Tx/Tz/Ty/Tz/Tx and a complimentary fast/medium/slow/medium/fast timing set transition sequence. FIG. 4d is similarly arranged as FIG. 4b including an SRL line 62, a timing set line 64, a symbol 66 representing the latch to be interrogated, and horizontal line 68, indicating crossovers in the timing transition sequence.

FIG. 5a illustrates yet another generic timing sequence for executing an exemplary binary search to locate a failed latch. In FIG. 5 the timing is varied across the shift register latches from a slow to fast timing set transition. Similarly, FIG. 5b illustrates a fast to slow timing set transition. FIGS. 5a and 5b represent a particular implementation of FIG. 4b and include an SRL line 70, a timing set line 72, a symbol 74, representing the latch where a transition occurs, and a horizontal line 76 representing a timing set transition point. As is well known in the art, during a binary search, searched elements, are divided into approximately equal halves, and each half is tested to determine if a latch has failed within that particular half. If a latch fails within a particular half, that half is then further divided into approximately equal halves and each half is tested for an SRL failure. This process repeats until the failed SRL latch or latches can be determined. Each timing sequence transition implemented in FIGS. 5a and 5b may each be executed as part of a single iteration of the binary search process.

Figure 6:
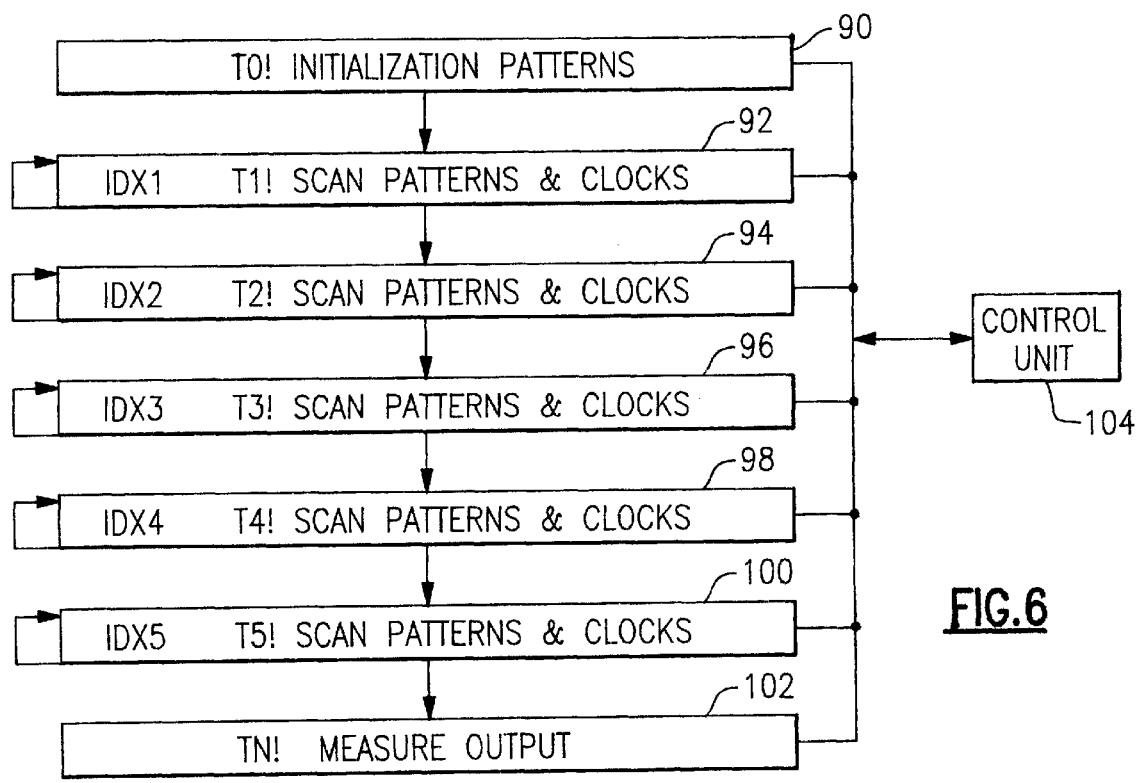
FIG. 6 illustrates a block diagram for the pattern and timing sequencing implementation of the AC scan chain test procedure of FIG. 3.

FIG. 6 illustrates a block diagram of a particular pattern and timing implementation configuration for effecting a binary search in the AC scan diagnostic system. Control begins at block 90. At block 90, the initialization patterns for propagation through the scan chains are initialized. Control then proceeds to block 92 which utilizes a timing set T1 to propagate selected scan patterns at various clock parameters through the scan chains to be tested. An index value IDX1 defines a loop index. The loop index effectively varies the number of SRLs through which the scan pattern is propagated using T1 timing set block 92. Control then proceeds to T2 timing set block 94 which operates similarly as described with respect to T1 timing set block 92, but utilizes index value IDX2 and timing set T2. Control successively proceeds through T3 timing set block 96, T4 timing set block 98, and T5 timing set block 100. Following execution of the respective timing set block 92–100, control proceeds to block 102 which measures the expected output from the tested scan chain latches. A control unit 104 enables variable control of each of the respective timing set blocks so that each timing set block may be updated in order to vary the patterns, the order of execution of the timing sets, and selected timing set parameters.

FIG. 7 illustrates an exemplary timing set, as may be implemented for any of timing sets T1, T2, T3, T4, or T5. In FIG. 7, a serial input (SRI) signal variation is shown as one of two signals which have opposite phases. Each A-clk and B-clk clock signal includes respective clock pulse signals 106, 108, and pulse widths 110, 112. The pulse widths 110, 112 define a variable parameter for a respective timing set. In addition to pulse width variation, the A-clk and B-clk signals cooperate to define a rate or period of repetition, which may also be varied. Further, the edge timing between a launch edge 114 and a capture edge 116 defines a variable parameter L1/L2. Similarly, the launch edge 118 of the B-clk pulse and capture edge 120 of the A-clk pulse defines an additional, variable parameter L2/L1.

Referring to the characterization phase block 58 of FIG. 3, the timing parameter, namely, the rate, the pulse width, and the launch/capture edges can be varied in order to better characterize the AC fail. Varying these parameters enables determination of the size the AC defect, parameter sensitivity, and further enables circuit localization. A characterization is typically done by modifying all timing edges and clock pulse widths for a specific set of scan path transitions. More specifically, once localized, the AC defect can be evaluated by relaxing all the timing edges except for the launch or capture edge of interest and schmooing the edges. For particular latch defects, this may also consist of schmooing the clock pulse widths to determine the feedback or latching properties of the circuit.

Figure 8:
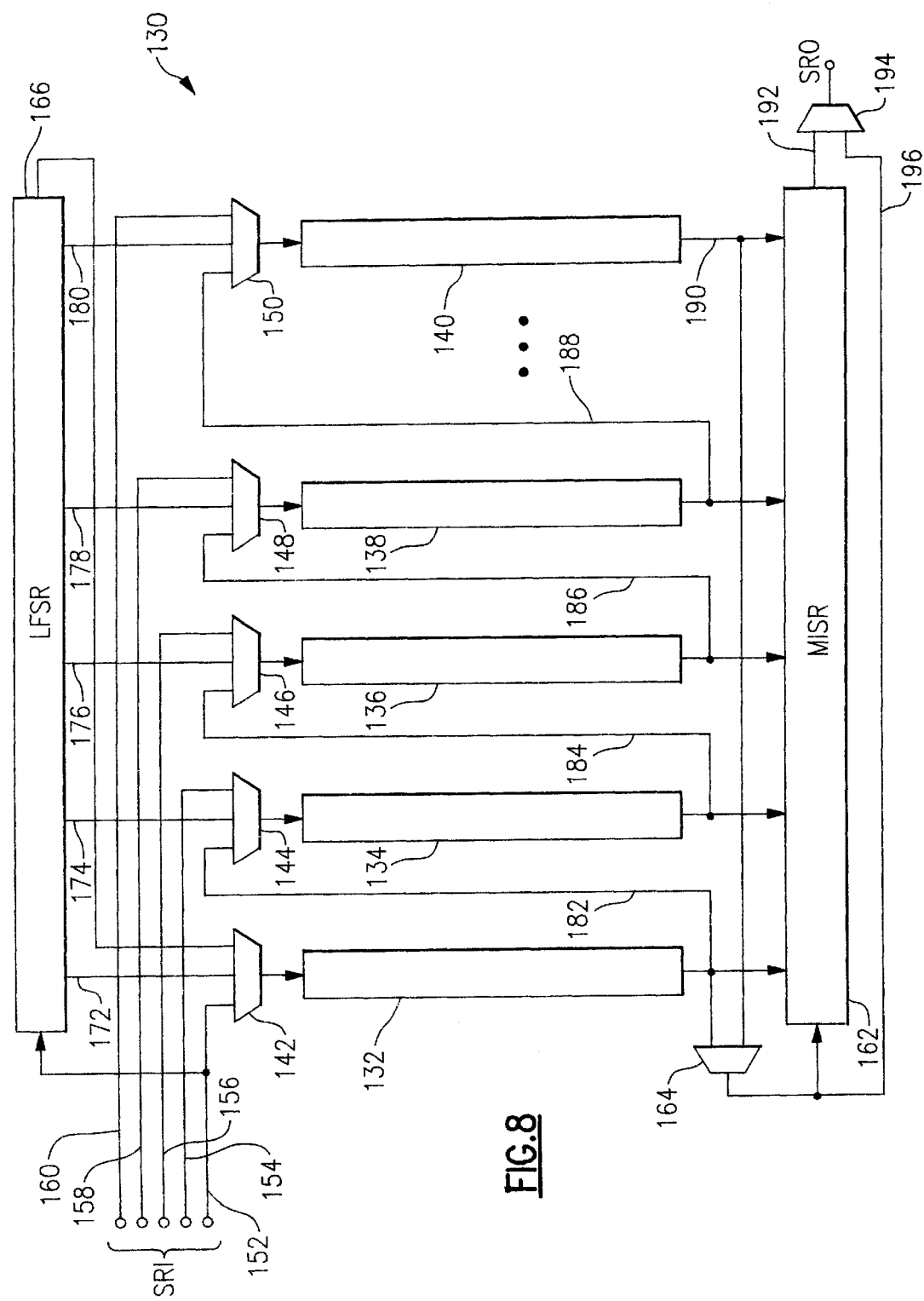
FIG. 8 illustrates a built-in self-test circuit for carrying out the AC scan chain test procedure in a self-test mode.
Figure 9:
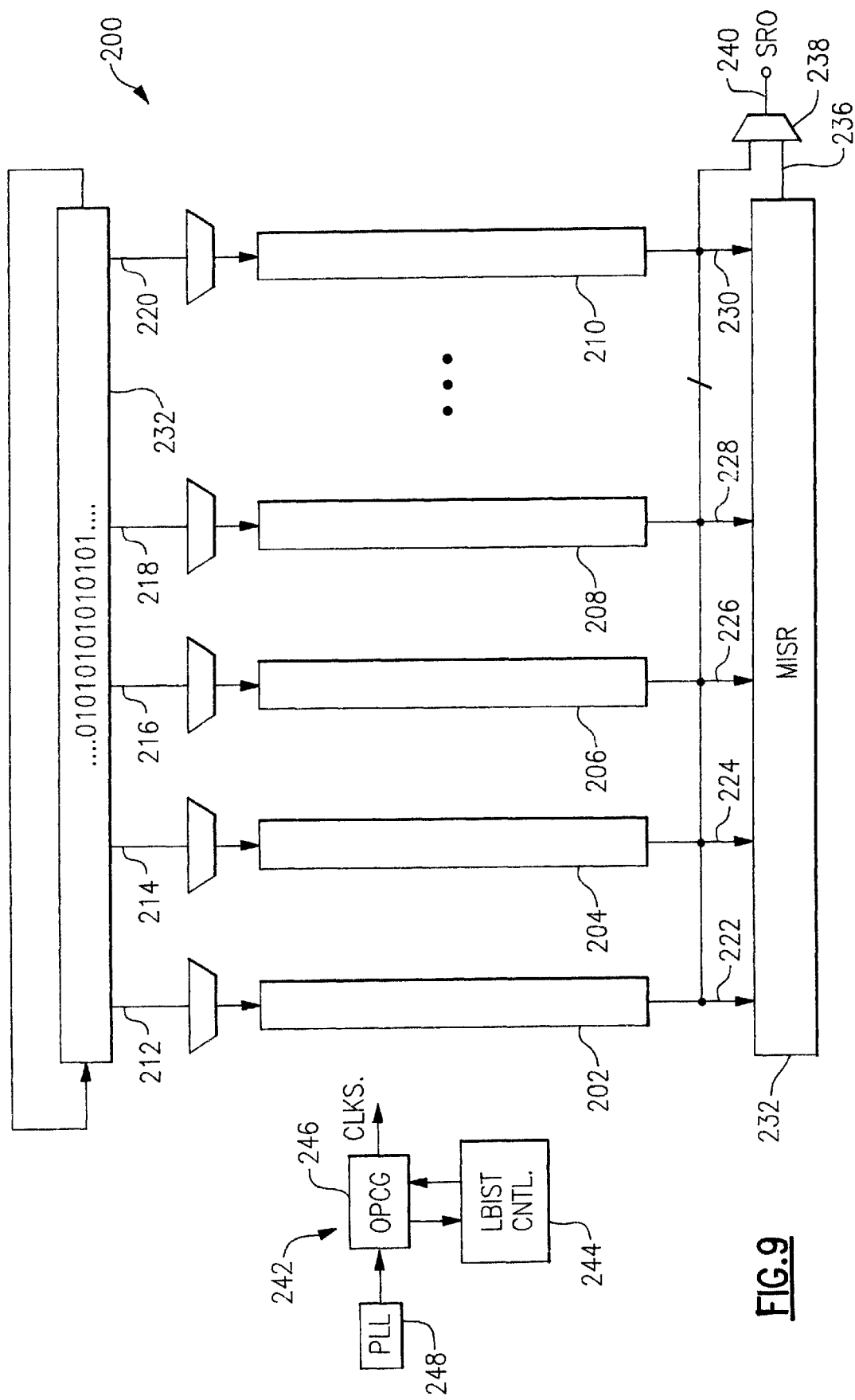
FIG. 9 illustrates a circuit for carrying out a built-in self-test procedure including on-product clock generation for an AC scan test procedure.

The diagnostic methodologies described above have been generally described in the context of an engineering test mode, but this concept can be simplified and automated for production testing on a manufacturing test system. By defining a reasonably sized test with minimal parameters and specific timing, the test can be included as part of the basic manufacturing test suite with minimal impact on test time. Collecting small amounts of failing data for the short test could support on-the-fly diagnostics in a manufacturing test mode. More particularly, FIGS. 8 and 9 illustrate the above-described test methodologies implemented on a built-in self test (LBIST) design that supports on-product clock generation where the scan operation can be performed at a much higher clock rates than shown in FIGS. 8 and 9. Such configurations are not limited by the test system speed.

With reference to FIG. 8, FIG. 8 illustrates a logic built-in self test (LBIST) system 130. The LBIST system 130 includes a plurality of scan chains 132, 134, 136, 138, 140. The number of scan chains may vary in accordance with particular design considerations. The scan chains interconnect combinational logic, such as shown in FIG. 1, but not shown in FIG. 8. One or a number of scan chains 132–140 may be defined as boundary scan register latches, self-test control macro register latches, or shift register latches, or the like.

The scan chains 132, 134, 136, 138, 140 may be loaded in a parallel manner, as described with respect to FIG. 1 or, may be loaded in a serial manner through multiplexers 142, 144, 146, 148, 150. Each scan chain 132–140 may be loaded directly via respective SRIs 152, 154, 156, 158, 160. Alternatively, SRI line 152 may be used to load shift scan chain 132 via multiplexer 142. Data loaded through SRI line 152 may be propagated through scan chain 132. At the output of scan chain 132, the data may be input to multiple input signature register (MISR) 162 via multiplexer 164. Alternatively, the output of scan chain 132 may be directed back to the input of scan chain 134 through multiplexer 144 on SRO line 182. This linking of scan chains may occur throughout the remainder of scan chains 136, 138, 140, so that the output of scan chain 140 is input to MISR 162 directly in a parallel-type load or serially via multiplexer 164.

SRI line 152 may also be used to provide an input, to a reconfigurable linear feedback shift register LFSR 166. LFSR 166 generates pseudo-random patterns and outputs the patterns for output to each of input lines 172, 174, 176, 178, 180 for input to scan chains 132–140 via respective multiplexers 142–150. Thus, each scan chain may be loaded directly via an SRI or from LFSR 166. Scan chain 132 may be also loaded via an output from, LFSR 166. Scan chains 134–140 may be also loaded through a linked configuration via the serial output from respective scan chains 132–138.

Similarly, MISR 162 may be loaded in a serial fashion via the output from multiplexer 164 or may be loaded in a parallel fashion via direct input from the respective SROs 182, 184, 186, 188, 190. MISR 162 generates a signature for the respective input bit patterns and outputs the signature on MISR output 192. The MISR output 192 is applied to multiplexer 194. Multiplexer 194 also receives a direct input 196 from multiplexer 164. In the current arrangement, multiplexer 194 outputs either a signature or SRL chain. The subject invention particularly address use of the above-described structures for AC scan chain diagnostics within an LBIST structure.

FIG. 9 depicts a configuration for an AC scan diagnostic circuit 200 for performing diagnostics on scan chains 202, 204, 206, 208, and 210. Scan chains 202–210 are configured to interconnect combinational logic blocks as is shown in FIG. 1, and may include boundary scan chains, self test control macro scan chains, and shift register latch chains. SRI lines 212, 214, 216, 218, 220 provide serial input to respective scan chains 202–210. Input to SRI lines 212–220 is provided through the output of LFSR 232. LFSR 232 is configured to recirculate a predetermined pattern, such as . . . 01010101. . . Scan chains 202–210 output a serial data signal on respective SROs 222, 224, 226, 228, 230. The SRO 222–230 are applied to MISR 232 which generates a signature based upon the inputs, as described above with respect to FIG. 9. MISR 232 outputs a serial data signal on output line 236 which is input to multiplexer 238. A second data line is input to multiplexer 238 so that multiplexer 238 selects between a signature or a scan chain for output on SRO line 240.

FIG. 9 also includes an on-product control circuit 242. On-product control circuit 242 includes an LBIST controller 244. LBIST controller 244 sends and receives control signals to on-product clock generator (OPCG). OPCG 246 outputs clock signals to control the respective LSFR 232, SRLs 202–210, MISR 232, and the like. A phase-lock-loop (PLL) circuit 248 multiplies the reference clock and synchronizes operation of OPCG 246.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for performing AC scan chain built-in self test and diagnostics of an integrated circuit, comprising:
    a reconfigurable linear feedback shift register (LFSR) having an input and a plurality of output lines, the LFSR generating a bit pattern;
    a plurality of scan chains having a plurality of latches, the scan chains interconnected to the LFSR, each scan chain serially receiving at a respective input the bit pattern output by the LFSR, and each scan chain propagating the bit pattern from the respective input to a respective output of each scan chain;
    a multiple input signature register (MISR), the MISR receiving the bit patterns output by the respective scan chains;
    the MISR generating a signature in accordance with the bit patterns input from the scan chains;
    a comparison circuit for comparing the signature with an expected signature based upon the pattern input to the plurality of scan chains, wherein when the signature is equal to the expected signature, the scan chains are functioning correctly; and
    a controller for reconfiguring the LFSR to vary the bit patterns output by the LFSR and for varying a timing sequence of operation of the LFSR, the plurality of scan chains, the MISR, and the comparison circuit.

2. The apparatus of claim 1 further comprising a plurality of serial data lines input to each of a respective scan chain latch for loading each scan chain latch independently of the LFSR.

3. The apparatus of claim 2 further comprising a plurality of multiplexers, the multiplexers selecting between one of the respective serial data lines and the output lines from the LFSR.

4. The apparatus of claim 3 wherein the scan chains are serially interconnected so that an output from one scan chain is applied to the input of a successive scan chain.

5. The apparatus of claim 4 wherein predetermined bit patterns are input to the respective scan chains in predetermined timing sets in accordance with control signals output by the controller.

6. The apparatus of claim 5 further comprising an on-board clock generator, the on-board clock generator receiving control signals from the controller and generating clock signals to effect a particular timing set in accordance with the control signals.

7. The apparatus of claim 6 wherein respective outputs of selected scan chains interconnect to the MISR in one of a serial and parallel manner, and wherein the comparison circuit compares the output of the MISR with an expected output determined in accordance with the input to the scan chains to identify a failing latch which works under some conditions but not all conditions.

8. An apparatus for performing AC scan chain built-in self test and diagnostics of an integrated circuit, comprising:
    a reconfigurable linear feedback shift register (LFSR) having an input and a plurality of output lines, the LFSR generating a bit pattern;
    a plurality of scan chains having a plurality of latches, the scan chains interconnected to the LFSR, each scan chain serially receiving at a respective input the bit pattern output by the LFSR, and each scan chain propagating the bit pattern from the respective input to a respective output of each scan chain;

a multiple input signature register (MISR), the MISR receiving the bit patterns output by the respective scan chains, the MISR generating a signature in accordance with the bit patterns input from the scan chains;

a comparison circuit for comparing the signature with an expected signature based upon the pattern input to the plurality of scan chains, wherein when the signature is equal to the expected signature, the scan chains are functioning correctly; and an on-product clock generator (OPCG) to generate clock signals to synchronize operation of the LSFR, the plurality of scan chains, and the MISR.

9. The apparatus of claim 8 further comprising a logic built-in self test (LBIST) controller for controlling operation of the OPCG, the LSFR, the plurality of scan chains, and the MISR.

10. The apparatus of claim 8 further comprising a phase-lock-loop (PLL) circuit, the phase lock loop circuit generating a control signal to the OPCG to control operation of the OPCG.

11. The apparatus of claim 8 further comprising a phase-lock-loop (PLL) circuit, the phase lock loop circuit generating a control signal to the OPCG to control operation of the OPCG.

12. An apparatus for performing AC scan chain built-in self test and diagnostics of an integrated circuit, comprising:

a reconfigurable linear feedback shift register (LFSR) having an input and a plurality of output lines, the LFSR generating a bit pattern;

a plurality of scan chains having a plurality of latches, the scan chains interconnected to the LFSR, each scan chain serially receiving at a respective input the bit pattern output by the LFSR, and each scan chain propagating the bit pattern from the respective input to a respective output of each scan chain;

a multiple input signature register (MISR), the MISR receiving the bit patterns output by the respective scan chains, the MISR generating a signature in accordance with the bit patterns input from the scan chains;

a comparison circuit for comparing the signature with an expected signature based upon the pattern input to the plurality of scan chains, wherein when the signature is equal to the expected signature, the scan chains are functioning correctly;

an on-product clock generator (OPCG) to generate clock signals to synchronize operation of the LSFR, the plurality of scan chains, and the MISR; and a logic built-in self test (LBIST) controller for controlling operation of the OPCG, the LSFR, the plurality of scan chains, and the MISR, wherein the LBIST varies generation of predetermined bit patterns input to the respective scan chains in predetermined timing sets.

13. The apparatus of claim 12 further comprising a plurality of serial data lines input to each of a respective scan chains loading each scan chain independently of the LFSR.

14. The apparatus of claim 12 further comprising a plurality of multiplexers, the multiplexers selecting between one of the respective serial data lines and the output lines from the LFSR.

15. The apparatus of claim 12 wherein the scan chain latches are serially interconnected so that an output from one scan chain latch is applied to the input of a successive scan chain latch.

16. The apparatus of claim 12 wherein the respective outputs of selected scan chains interconnect to the MISR in one of a serial and parallel manner, and wherein the comparison circuit compares the output of the MISR with an expected output determined in accordance with an the input to the scan chains to identify a failing latch which works under some conditions but not all conditions.

* * * * *